(12) United States Patent
Anai et al.

(10) Patent No.: US 12,030,125 B2
(45) Date of Patent: Jul. 9, 2024

(54) BONDED BODY AND METHOD FOR MANUFACTURING SAME

(71) Applicant: Mitsui Mining & Smelting Co., Ltd., Tokyo (JP)

(72) Inventors: Kei Anai, Ageo (JP); Shinichi Yamauchi, Ageo (JP); Jung-Lae Jo, Ageo (JP); Takahiko Sakaue, Ageo (JP)

(73) Assignee: Mitsui Mining & Smelting Co., Ltd. (JP)

( * ) Notice: Subject to any disclaimer, the term of this patent is extended or adjusted under 35 U.S.C. 154(b) by 131 days.

(21) Appl. No.: 17/434,492

(22) PCT Filed: Mar. 2, 2020

(86) PCT No.: PCT/JP2020/008653
§ 371 (c)(1),
(2) Date: Aug. 27, 2021

(87) PCT Pub. No.: WO2020/202970
PCT Pub. Date: Oct. 8, 2020

(65) Prior Publication Data
US 2022/0139865 A1 May 5, 2022

(30) Foreign Application Priority Data

Mar. 29, 2019 (JP) .................. 2019-068287

(51) Int. Cl.
*B22F 7/06* (2006.01)
*B22F 1/00* (2022.01)
(Continued)

(52) U.S. Cl.
CPC ................ *B22F 7/064* (2013.01); *B22F 1/00* (2013.01); *B22F 1/107* (2022.01); *H01L 24/29* (2013.01);
(Continued)

(58) Field of Classification Search
CPC . H01L 2224/2901–29019; H01L 2224/08056; H01L 2224/08057;
(Continued)

(56) References Cited

U.S. PATENT DOCUMENTS

2016/0151864 A1* 6/2016 Rector .................... H01L 24/83
428/615
2020/0043834 A1* 2/2020 Shiraki ............. H01L 23/49575

FOREIGN PATENT DOCUMENTS

JP         S53-61973 A      6/1978
JP         2013-196936 A    9/2013
(Continued)

OTHER PUBLICATIONS

International Search Report (English and Japanese) of the International Searching Authority issued in PCT/JP2020/008653, dated Mar. 31, 2020; ISA/JP (7 pages).

*Primary Examiner* — Julio J Maldonado
*Assistant Examiner* — Stanetta D Isaac
(74) *Attorney, Agent, or Firm* — Harness, Dickey & Pierce, P.L.C.

(57) ABSTRACT

A bonded body is provided including: a bonding layer containing Cu; and a semiconductor element bonded to the bonding layer. The bonding layer includes an extending portion laterally extending from a peripheral edge of the semiconductor element. In a cross-sectional view in a thickness direction, the extending portion rises from a peripheral edge of a bottom of the semiconductor element or from the vicinity of the peripheral edge of the bottom of the semiconductor element, and includes a side wall substantially spaced apart from a side of the semiconductor element. Preferably, the extending portion does not include any portion where the side wall and the side of the semiconduc-
(Continued)

tor element are in contact with each other. A method for manufacturing a bonded body is also provided.

9 Claims, 4 Drawing Sheets

(51) Int. Cl.
  *B22F 1/107* (2022.01)
  *H01L 23/00* (2006.01)
(52) U.S. Cl.
  CPC .............. *H01L 24/32* (2013.01); *H01L 24/83* (2013.01); *H01L 2224/29147* (2013.01); *H01L 2224/32058* (2013.01); *H01L 2224/32245* (2013.01); *H01L 2224/83192* (2013.01); *H01L 2224/83203* (2013.01); *H01L 2224/8384* (2013.01)
(58) Field of Classification Search
  CPC ....... H01L 2224/08059; H01L 2224/07; H01L 2224/08; H01L 2224/0801; H01L 2224/0805; H01L 24/01; H01L 24/03; H01L 24/07; H01L 24/08; H01L 24/09; H01L 24/15; H01L 24/16; H01L 24/17; H01L 2224/01; H01L 2224/26; H01L 2224/31; H01L 2224/32; H01L 2224/3205; H01L 2224/32052; H01L 2224/32056; H01L 2224/32057; H01L 2224/32058; H01L 2224/32059; H01L 2924/00012; H01L 2224/29347; H01L 2424/013; H01L 2424/01013; H01L 2924/00014; H01L 2924/013; H01L 2924/01046; H01L 2924/01047; H01L 2924/01079; H01L 2924/01028; H01L 2924/0105; H01L 2224/29344; H01L 2224/1601–16014; H01L 2224/1605–1607; H01L 2224/161–16268; H01L 2224/1703; H01L 2224/17051–17055; H01L 2224/171–17183

See application file for complete search history.

(56) References Cited

FOREIGN PATENT DOCUMENTS

| | | |
|---|---|---|
| JP | 2014-120639 A | 6/2014 |
| JP | 2017-71826 A | 4/2017 |
| JP | 2018-111872 A | 7/2018 |
| JP | 2018-129352 A | 8/2018 |
| JP | 2019-216183 A | 12/2019 |
| WO | 2015-060346 A1 | 4/2015 |
| WO | 2019-021637 A1 | 1/2019 |
| WO | 2020-032161 A1 | 2/2020 |

* cited by examiner

BONDED BODY AND METHOD FOR MANUFACTURING SAME

CROSS-REFERENCE TO RELATED APPLICATIONS

This application is a U.S. National Phase Application under 35 U.S.C. 371 of International Application No. PCT/JP2020/008653, filed on Mar. 2, 2020, which claims priority to Japanese Patent Application No. 2019-068287, filed on Mar. 29, 2019. The entire disclosures of the above applications are expressly incorporated by reference herein.

BACKGROUND

Technical Field

The present invention relates to a bonded body and a method for manufacturing the same.

Related Art

With the recent global trend for energy efficiency and conservation, semiconductor elements called power devices have been widely used as power conversion/control devices such as inverters. Unlike integrated circuits such as memories and microprocessors, power devices are used to control high current and high voltage and therefore tend to generate a very large amount of heat during driving. Therefore, in order to prevent damage to semiconductor elements due to heat generation, semiconductor packages need to be provided with countermeasures against heat, such as a cooling system.

Also, in order to improve the efficiency and compactness of semiconductor elements, an electronic component called a power module is used, in which a plurality of semiconductor elements are mounted on a bonded body including a ceramic plate and Cu present on both side thereof. However, as the size of power modules is smaller, the heat generated during driving is more likely to accumulate therein. Accordingly, if bonding material having a low heat-resistance, such as a soldering material, is used, a module failure may occur.

In view of addressing the above-described problems, bonding materials formed by sintering metal particles of silver, copper, or the like have garnered attention as materials that can replace soldering materials. For example, JP 2014-120639A discloses a semiconductor system including a metal substrate, a first bonding layer arranged on a surface of the metal substrate, a semiconductor element arranged on the metal substrate via the first bonding layer, and a fillet layer arranged on side wall portions of the semiconductor element and the first bonding layer and made of the same material as the first bonding layer.

In the semiconductor system disclosed in JP 2014-120639A, the fillet layer is in direct contact with a side wall of the semiconductor element. However, if a fillet layer containing Cu is in contact with a side wall of a semiconductor element made of, for example, a SiC-based material, thermal diffusion of Cu into the semiconductor element occurs in a high-temperature environment that is created during driving, for example, and may consequently cause a failure in the semiconductor element or separation and cracking of the bonding layer and the fillet layer.

Therefore, an object of the present invention is to provide a bonded body which includes a semiconductor element and has high heat resistance and in which the characteristics of the semiconductor element are unlikely to be adversely affected, and also to provide a method for manufacturing the bonded body.

SUMMARY

The present invention provides a bonded body including: a bonding layer containing Cu; and a semiconductor element bonded to the bonding layer,
wherein the bonding layer includes an extending portion laterally extending from a peripheral edge of the semiconductor element, and
in a cross-sectional view in a thickness direction, the extending portion rises from a peripheral edge of a bottom of the semiconductor element or from a vicinity of the peripheral edge of the bottom of the semiconductor element, and includes a side wall substantially spaced apart from a side of the semiconductor element.

Also, the present invention provides a method for manufacturing a bonded body, the method including:
applying a composition for a bonding layer to a surface of a conductor to form a coating film, wherein the composition contains a metal powder containing Cu and a solid reducing agent;
drying the coating film to form a dried coating film;
then superposing a semiconductor element on the dried coating film to obtain a stack in which the dried coating film is located between the conductor and the semiconductor element, and subsequently heating the stack while applying a pressure thereto to sinter the metal powder to thereby bond the conductor and the semiconductor element together.

DETAILED DESCRIPTION

Figure 1A:
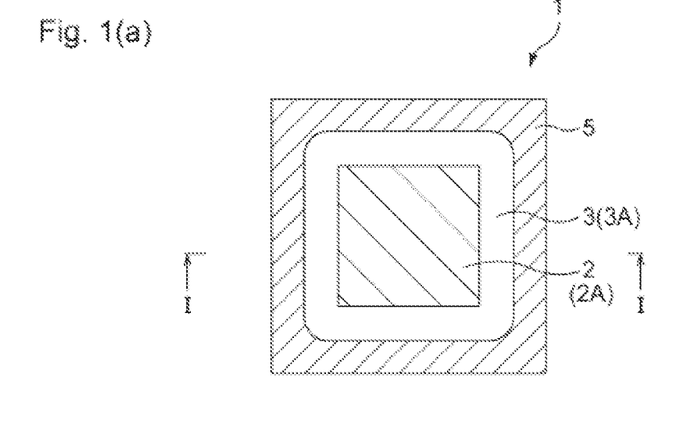
FIG. 1(a) is a schematic plan view of a bonded body of the present invention.
Figure 1B:
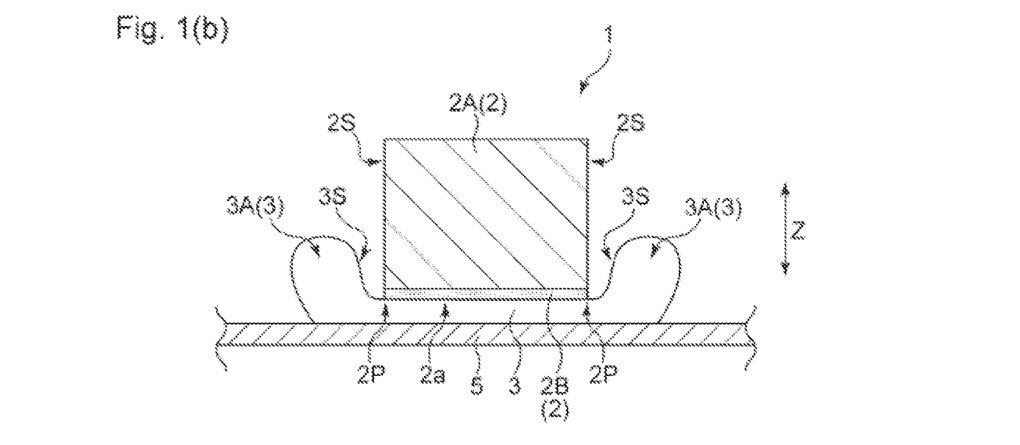
FIG. 1(b) is a cross-sectional view taken along line I-I in FIG. 1(a).

Hereinafter, the present invention will be described based on preferred embodiments thereof, with reference to the drawings. As shown in FIGS. 1(a) and 1(b), a bonded body 1 is formed by bonding a semiconductor element 2 and a bonding layer 3 containing Cu together. The bonded body 1 shown in FIGS. 1(a) and 1(b) further includes a conductor 5 such as a substrate, and is configured such that the semiconductor element 2 and the conductor 5 can be electrically connected to each other by bonding them together via the bonding layer 3.

The semiconductor element 2 is a member constituting the bonded body 1, and has a semiconductor chip 2A and an electrode 2B arranged on the bottom surface of the chip 2A. The semiconductor chip 2A of the semiconductor element 2 preferably contains mainly Si, and more preferably contains Si in an amount of 50 mass % or more. Depending on the use of the bonded body 1, the semiconductor element 2 may contain atoms such as Ga, Ge, C, N, and As, in addition to, or instead of, Si. Also, an upper electrode (not shown) is arranged on an upper portion of the semiconductor chip 2A of the semiconductor element 2, and electrical connection in a thickness direction Z can be achieved. In addition, it is preferable that a protective layer (not shown) for preventing a bottom surface of the semiconductor element 2 from coming into direct contact with the bonding layer 3 be provided on the bottom surface of the semiconductor element 2. Any conductive layer used in the art can be used as the protective layer without particular limitation, and examples thereof include metal layers containing Au, Ag, Ti, Ni, or others.

The bonding layer 3 contains Cu, and preferably contains Cu in an amount of 50 mass % or more, and more preferably 60 mass % or more. As shown in FIGS. 1(a) and 1(b), the bonding layer 3 is located between the semiconductor element 2 and the conductor 5. In addition, the bonding layer 3 includes an extending portion 3A laterally extending from a peripheral edge 2P of the semiconductor element 2. The extending portion 3A of the present embodiment is formed by extending the bonding layer 3, which is located between the semiconductor element 2 and the conductor 5, and therefore, the bonding layer 3 and the extending portion 3A are made of the same materials. The Cu content in the bonding layer 3 and the extending portion 3A can be measured, for example, in a cross section of the bonded body 1 in the thickness direction, by analyzing the bonding layer 3 and the extending portion 3A that are present in the cross section through EDX (energy dispersive X-ray spectroscopy) using a scanning electron microscope and quantifying Cu.

In a cross-sectional view of the bonded body 1 in the thickness direction Z, the extending portion 3A rises from, or from the vicinity of, the peripheral edge 2P of a bottom 2a of the semiconductor element 2, and a side wall 3S of the extending portion 3A is thus formed. As used herein the term "vicinity" refers to a region from the peripheral edge 2P to a distance of 20 μm or less therefrom in a planar direction of the bonded body 1. The above-described distance is measured by resin embedding and then polishing the bonded body, and observing the polished surface under an electron microscope.

Figure 3A:
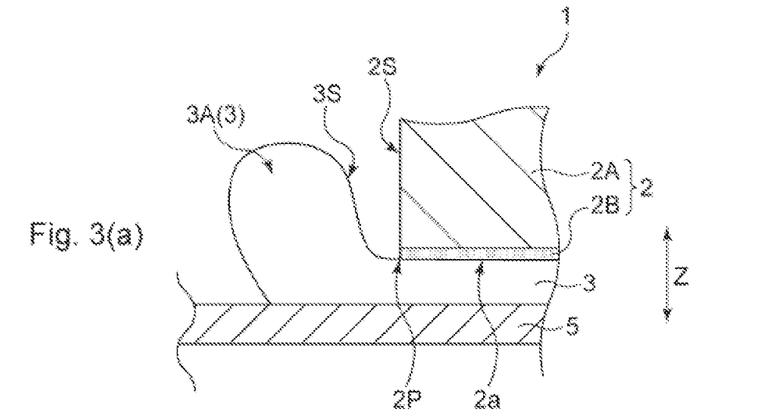
FIGS. 3(a) to 3(c) are schematic views showing positions of extending portions and semiconductor elements according to embodiments of the bonded body of the present invention.
Figure 3B:
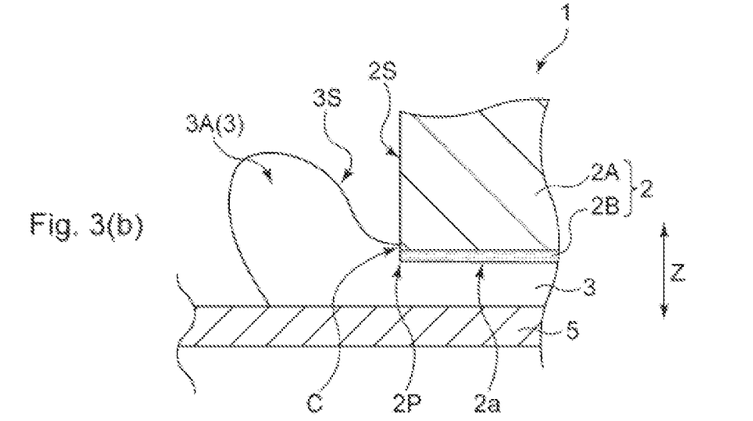
Figure 3C:
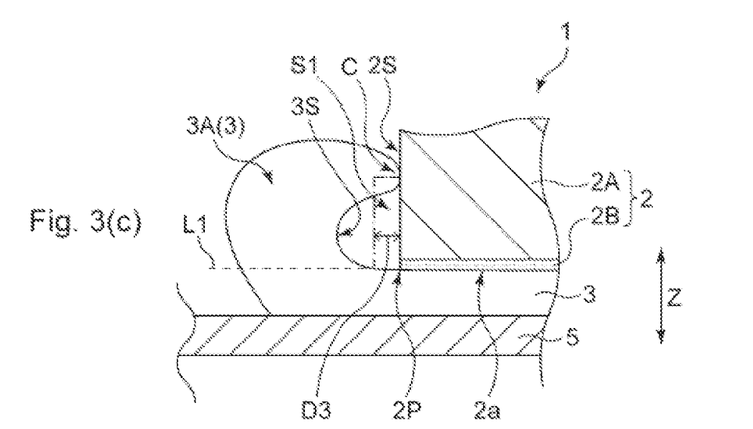
Figure 4:
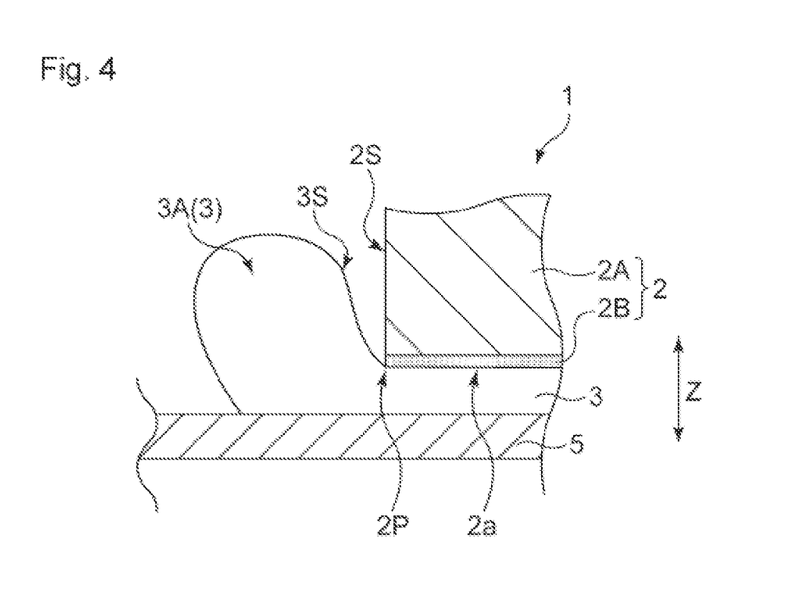
FIG. 4 is a schematic view showing positions of an extending portion and a semiconductor element according to another embodiment of the bonded body of the present invention.

Regarding the form of the rise of the extending portion 3A, the extending portion 3A may rise, for example, from the vicinity of the peripheral edge 2P of the bottom 2a of the semiconductor element, as shown in FIGS. 3(a) to 3(c). Alternatively, as shown in FIG. 4, the extending portion 3A may rise directly from the peripheral edge 2P of the bottom 2a of the semiconductor element 2.

As described above, the extending portion 3A includes the side wall 3S. The side wall 3S is substantially spaced apart from the side 2S of the semiconductor element 2. As used herein, the term "substantially" is intended to exclude the intentional formation of a contact portion between the side 2S of the semiconductor element and the extending portion 3A in the manufacturing process of the bonded body 1, and it is acceptable that a contact portion C between the side 2S of the semiconductor element 2 and the extending portion 3A is locally formed inevitably. In the case where a contact portion C between the side 2S of the semiconductor element and the extending portion 3A is present, the side wall 3S is considered to be "substantially spaced apart" if the length of the contact portion C in the thickness direction Z in a cross-sectional view in the thickness direction Z and the length of the contact portion C in the planar direction in a plan view are both 20 μm or less. The length of the contact portion C in the thickness direction Z and the length of the contact portion C in the planar direction are each preferably 10 μm or less, in view of reducing the diffusion of Cu contained in the bonding layer into the semiconductor element.

The form of a contact portion C inevitably formed is not limited, and it may be, for example, a form in which a contact portion C between the side 2S near the bottom of the semiconductor element 2 and the extending portion 3A is inevitably formed, as shown in FIG. 3(b), or a form in which a contact portion C between the side 2S near the top of the semiconductor element 2 and the extending portion 3A is inevitably formed, as shown in FIG. 3(c). The length of the contact portion C is measured by resin embedding the bonded body, then polishing the bonded body in the thickness direction or the planar direction, and observing the polished surface under an electron microscope.

The form of the rise of the extending portion 3A and the form of the space between the extending portion 3A and the side 2S of the semiconductor element have been described above with reference to one cross-sectional view of the bonded body 1 in the thickness direction for the sake of convenience of description. However, since the extending portion 3A is formed around the semiconductor element 2 as shown in FIG. 1(a), the following is preferable: when considering an imaginary circle having its center at the centroid of the semiconductor element 2 in a plan view, and also imaginary radial lines that pass through the center of the imaginary circle and cut the imaginary circle at intervals of 30°, the distances measured by observing cross sections of the bonded body 1 that are taken along the imaginary radial lines at intervals of 30° in the plan view are all within the above-described range. In FIG. 1(a), the extending portion 3A is formed along the entire periphery of the semiconductor element 2; however, the present invention is not limited to such a configuration, and the extending portion 3A may be intermittently formed around the periphery of the semiconductor element 2.

In the bonded body having the above-described configuration, the semiconductor element and the conductor are bonded together via the Cu-containing bonding layer with its contact area with the side of the semiconductor element minimized. Therefore, even when an electronic component having the bonded body is driven and creates a high-temperature environment, the diffusion of Cu contained in the bonding layer into the semiconductor element can be reduced. As a result, the characteristics of the semiconductor element can be realized sufficiently. Also, since Cu in the bonding layer is unlikely to diffuse into the semiconductor element side, cracking of the bonding layer is unlikely to occur even in a high-temperature environment, and high heat resistance is thus obtained. In addition, when compared with a case in which a bonding layer that contains Ag, whose atoms are unlikely to diffuse into the semiconductor element, is formed, the bonding layer that contains Cu also has the advantage of having sufficient strength and electrical conductivity while reducing the manufacturing cost.

Preferably, the extending portion 3A of the bonding layer 3 does not include any portion where the side wall 3S thereof and the side 2S of the semiconductor element 2 are in contact with each other, in view of effectively preventing an adverse effect of the diffusion of Cu on the semiconductor element. More specifically, as shown in FIGS. 3(a) and 4, it is preferable that the side wall 3S and the side 2S of the semiconductor element 2 be completely spaced apart from each other, and that no contact portions C are thus present.

This configuration can be obtained by, for example, appropriately adjusting the thickness of a coating film formed in a manufacturing method, which will be described later, and also the conditions for drying the coating film and the conditions for pressure sintering. Although the foregoing description has been given with reference to a cross-sectional view of one arbitrary portion of the bonded body 1 in the thickness direction for the sake of convenience of description, it is preferable that the foregoing description be appropriately applied to the entire periphery of the semiconductor element 2 as well.

Also, from the same viewpoint, the average distance between the side wall 3S and the side 2S of the semiconductor element 2, D3, is preferably 1 μm or more, and more preferably 5 μm or more. Moreover, in view of reducing unnecessary space in the bonded body and reducing the cost by reducing the materials used to form the bonded body, the average distance D3 is practically 5 mm or less.

Figure 2:
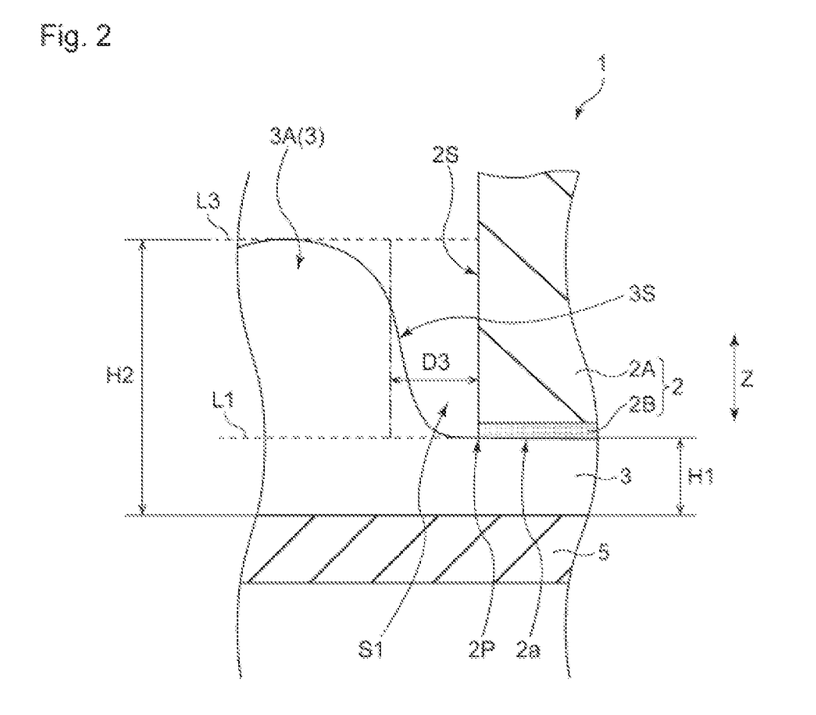
FIG. 2 is a schematic enlarged view of the main portion in FIG. 1(b).

The average distance D3 is a value measured and calculated using the following method. As shown in FIG. 2, in a cross-sectional view of the bonded body 1 in the thickness direction Z, the third imaginary straight line L3, which passes through an upper end of the extending portion 3A in the thickness direction Z and is parallel to the bottom surface of the semiconductor element 2, is drawn, and the area of the region defined by the side 2S of the semiconductor element 2, the side wall 3S, and the third imaginary straight line L3 is obtained. An imaginary rectangle S1 is considered that has the same area as the obtained area and has, as its one side, a line segment having the same length as the distance between the first imaginary straight line L1, which is an imaginary extension line of the bottom surface, and the third imaginary straight line L3 in the thickness direction Z. The length of the other side of the imaginary rectangle Si is used as the average distance D3. On the other hand, in the case where a contact portion with an upper portion of the semiconductor element 2 is present as shown in FIG. 3(c), the average distance is obtained in the following manner: in a cross-sectional view of the bonded body 1 in the thickness direction Z, an imaginary rectangle is considered that has the same area as the area of the region defined by the side 2S of the semiconductor element 2 and the side wall 3S and has, as its one side, a line segment having the same length as the distance between the first imaginary straight line L1 and the contact portion C in the thickness direction Z; and the length of the other side of the imaginary rectangle is used as the average distance D3. These distances can be measured and calculated through observation under an electron microscope as is the case with the measurement method for the contact portion C. The foregoing description for the form of the extending portion 3A spaced apart has been given with reference to a cross-sectional view of one arbitrary portion of the bonded body 1 in the thickness direction for the sake of convenience of description. However, the following is preferable: when considering an imaginary circle having its center at the centroid of the semiconductor element 2 in a plan view, and also imaginary radial lines that pass through the center of the imaginary circle and cut the imaginary circle at intervals of 30°, all of the average distances measured by observing respective cross sections of the bonded body 1 that are taken along the imaginary radial lines at intervals of 30° in the plan view are within the above-described range.

Also, in view of effectively preventing an adverse effect of the diffusion of Cu on the semiconductor element, the bonded body 1 is preferably formed such that the distance between the side wall 3S and the side 2S of the semiconductor element 2 gradually increases from the bottom 2a of the semiconductor element 2 toward the upper side as shown in FIGS. 3(a) and 3(b) and 4, for example. Alternatively, the bonded body 1 is preferably formed such that the distance between the side wall 3S and the side 2S of the semiconductor element 2 is constant. That is to say, it is preferable that the side wall 3S extends in the thickness direction Z. These configurations can prevent the extending portion 3A from unintentionally coming into contact with the side 2S of the semiconductor element 2 due to, for example, the application of an external force.

In view of improving the manufacturing efficiency, realizing high bonding strength, and ensuring high electrical conductivity, the thickness of the bonding layer 3, H1 (see FIG. 2), is preferably from 1 μm to 200 μm, and more preferably from 3 μm to 150 μm. The thickness of a bonding portion can be controlled by, for example, adjusting the thickness of a coating film formed in the manufacturing method, which will be described later, and also the conditions for pressure sintering. The thickness of the bonding layer 3 is preferably as follows: when considering an imaginary circle having its center at the centroid of the semiconductor element 2 in a plan view, and also imaginary radial lines that pass through the center of the imaginary circle and cut the imaginary circle at intervals of 30°, the average of the thicknesses measured by observing, under an electron microscope, respective cross sections of the bonded body 1 that are taken along the imaginary radial lines at intervals of 30° in the plan view is within the above-described range.

Also, from a similar viewpoint, the thickness H2 of the extending portion 3A in the thickness direction Z (hereinafter also referred to as "height H2", see FIG. 2) is preferably 250 μm or less, and more preferably 150 μm or less. The height H2 of the extending portion 3A can be controlled by, for example, appropriately adjusting the thickness of a coating film formed in the manufacturing method, which will be described later, and also the conditions for drying the coating film and the conditions for pressure sintering. The height H2 is an arithmetic mean value of heights obtained along the entire periphery of the extending portion 3A formed in the bonding layer 1, and can be determined in the same manner as for the above-described length H1.

Next, a method for manufacturing a bonded body will be described. The present manufacturing method is roughly divided into three steps: the step of applying a Cu-containing composition for a bonding layer to a surface of a conductor such as a substrate to form a coating film (application step); the step of drying the coating film to form a dried coating film (drying step); and the step of superposing a semiconductor element on the dried coating film and heating the resultant while applying a pressure thereto to bond the semiconductor element and the conductor together (bonding step).

First, the Cu-containing composition for a bonding layer is applied to the surface of the conductor to form a coating film. The details of the composition for a bonding layer will be described later.

There is no particular limitation on the means of application of the composition for a bonding layer, and a known application means can be used. For example, screen printing, dispense printing, rotogravure printing, offset printing, or others can be used. In view of the ease of application, the composition for a bonding layer is preferably a paste-like or ink-like composition containing a liquid medium.

In view of forming a bonded structure that stably has high bonding strength, the thickness of the coating film to be formed is preferably 1 μm to 250 μm, and more preferably 5 μm to 150 μm, immediately after the application. Also, in view of increasing the bonding strength to the object to be bonded, the application area of the coating film is preferably larger than the area of the bottom surface of the semiconductor element, which is the object to be bonded, in a plan view.

Next, the coating film formed is dried to obtain a dried coating film. In this step, at least a portion of the liquid medium is removed from the coating film through drying to obtain a dried coating film in which the amount of liquid medium has been reduced. The shape retention of the dried coating film can be improved by removing the liquid medium from the coating film, and, since the dried coating film in such a state bonds the semiconductor element and the substrate together, high bonding strength can be achieved. The dried coating film refers to a coating film having a liquid medium content of 9 mass % or less based on the total mass of the film. Except for the liquid medium, the amounts of constituent materials contained in the coating film are substantially equal to those in the dried coating film, which is obtained by drying the coating film. For this reason, the liquid medium content can be calculated by, for example, determining the change in the mass of the coating film before and after the drying.

In order to remove the liquid medium through drying, the liquid medium can be volatilized using a drying method such as natural drying due to the volatility of the liquid medium, hot air drying, infrared irradiation, or hot plate drying. The liquid medium content in the dried coating film after the removal of the liquid medium is, as described above, preferably 9 parts by mass or less, more preferably 7 parts by mass or less, and even more preferably 5 parts by mass or less, with respect to 100 parts by mass of the total mass of the coating film. This step can be modified as appropriate depending on the components of the composition for a bonding layer, but it is preferable to perform this step in an air atmosphere at a temperature of 40° C. to 150° C. under atmospheric pressure for 1 minute to 60 minutes.

Lastly, the semiconductor element is superposed on the dried coating film and bonded. More specifically, after the dried coating film has been obtained through the above-described steps, the semiconductor element is superposed on the dried coating film to obtain a stack including the conductor, the semiconductor element, and the dried coating film located therebetween.

Subsequently, the stack is heated while applying a pressure thereto to sinter the metal powder contained in the dried coating film, to thereby form a bonding layer that bonds the conductor and the semiconductor element together. During the sintering, the atmosphere is preferably an inert gas atmosphere such as a nitrogen atmosphere. The sintering temperature is preferably less than 300° C., more preferably 150° C. or more and less than 300° C., even more preferably 200° C. or more and less than 300° C., and yet even more preferably 230° C. or more and less than 300° C. The pressure that is applied during the sintering is preferably 0.001 MPa or more, more preferably from 0.001 MPa to 20 MPa, and even more preferably from 0.01 MPa to 15 MPa. The sintering time is preferably 20 minutes or shorter, more preferably from 0.5 minutes to 20 minutes, and even more preferably from 1 minute to 30 minutes, on condition that the sintering temperature is within the above-described range.

In particular, in the manufacturing method, a dried coating film with high shape retention is formed as a result of the volatilization of the liquid medium. Therefore, the dried coating film does not undergo plastic deformation, such as melting and softening, caused by heating, and the shape retention of the dried coating film is maintained even during the firing of the coating film under pressure. Thus, a portion of the dried coating film on which the semiconductor element is present is compressed and forms a bonding layer. In addition, a portion of the dried coating film that is present along the peripheral edge of the semiconductor element is sintered without pressure and therefore forms an extending portion laterally extending from the peripheral edge of the semiconductor element and rising from the peripheral edge of the bottom of the semiconductor element. As a result, the semiconductor element and the conductor are bonded together via the Cu-containing bonding layer with its contact area with the side of the semiconductor element minimized. Therefore, even when an electronic component having the bonded body is driven and creates a high-temperature environment, the diffusion of Cu contained in the bonding layer into the semiconductor element can be reduced.

In the bonded body that has been formed through the above-described steps, the bonding layer is a sintered material of Cu-containing metal particles included in the composition for a bonding layer. Also, the bonding layer includes the extending portion laterally extending from the peripheral edge of the semiconductor element. The bonding layer contains Cu, and, in the case where the bonding layer contains a solid reducing agent, which will be described later, a structure (3) below is formed in the bonding layer.

[Chem. 1]

(3)

In the formula, $R^3$ to $R^5$ each independently represent a hydrogen atom, a hydroxyl group, a hydrocarbon group having 1 to 10 carbon atoms, or a hydrocarbon group having 1 to 10 carbon atoms and having a hydroxyl group. The descriptions for $R^3$ to $R^5$ in the chemical formulae (1) and (2), which will be described later, also apply to $R^3$ to $R^5$ in the structure (3) as appropriate. In the formula, * represents a Cu-binding site.

Whether or not the structure (3) is formed in the bonding layer can be checked by, for example, performing mass spectrometry (TOF-SIMS) on a cross section of the bonding portion. For example, in the case where BIS-TRIS is used as the reducing agent, a fragment of a molecular weight of 152 assigned to $C-N(Cu)_2$ is observed in a TOF-SIMS mass spectrum on the cathode side.

The composition for a bonding layer contains a metal powder containing Cu, and preferably further contains a solid reducing agent and a liquid medium.

The metal powder used in the present invention is preferably an assemblage of metal particles containing Cu. The metal powder may further contain at least one metal selected from gold, silver, palladium, aluminum, nickel, and tin, as necessary. These metals may be contained in the form of, for example, an assemblage of Cu particles made substantially only of Cu; an assemblage of the Cu particles and other metal particles made of a single metal; an assemblage of Cu alloy particles containing Cu and another metal; or an assemblage of the Cu particles and the Cu alloy particles.

The metal particles in the metal powder used in the present invention may have, for example, a spherical shape, a flat (flake-like) shape, a dendritic (branching tree-like) shape, or a rod-like shape, and these shapes may be applied singly or in combinations of two or more thereof.

The solid reducing agent contained in the composition for a bonding layer is solid at room temperature (25° C.) and is used to promote sintering the metal particles during the firing of the composition to thereby realize high bonding strength. For this purpose, it is advantageous that the solid reducing agent be a solid reducing agent with a chemical structure having at least one amino group and two or more hydroxyl groups. The wording "is solid at room temperature (25° C.)" means that the melting point of the solid reducing agent is higher than 25° C.

It is preferable that the melting point of the solid reducing agent be equal to or lower than the sintering temperature of the metal powder. It is also preferable that the boiling point of the solid reducing agent be higher than the boiling point of the liquid medium, which will be described later. If a solid reducing agent having such characteristics is used, the solid reducing agent can remain in the form of a solid in the composition for a bonding layer when drying the coating film formed of the composition to obtain the dried coating film, and consequently, the shape retention of the resulting dried coating film formed of the composition can be improved. Furthermore, during the firing of the dried coating film formed of the composition for a bonding layer, the solid reducing agent melts and diffuses throughout the coating film, and therefore, the sintering of the metal powder is uniformly promoted. Thus, a bonded body with an even denser sintered structure can be obtained which has high electrical conduction reliability.

In view of realizing both high bonding strength by the pressure bonding and high electrical conduction reliability after the pressure bonding, an amino alcohol compound represented by the chemical formula (1) or (2) below is preferably used as the solid reducing agent.

[Chem. 2]

In the chemical formula (1) or (2), $R^1$ to $R^6$ each independently represent a hydrogen atom, a hydroxyl group, a hydrocarbon group having 1 to 10 carbon atoms, or a hydrocarbon group having 1 to 10 carbon atoms and having a hydroxyl group. In the formula (2), $R^7$ represents a hydrocarbon group having 1 to 10 carbon atoms or a hydrocarbon group having 1 to 10 carbon atoms and having a hydroxyl group. The hydrocarbon group may be a saturated or unsaturated aliphatic group. The aliphatic group may be linear or branched.

In the reducing agent represented by the chemical formula (1), at least one of $R^1$ to $R^5$ preferably contains a hydroxyl group in view of improving the sinterability of the metal particles, and more preferably three or more, even more preferably four or more, or yet even more preferably all of $R^1$ to $R^5$ contain a hydroxyl group. From the same viewpoint, in the reducing agent represented by the chemical formula (2), at least one of $R^1$ to $R^6$ preferably contains a hydroxyl group, and more preferably three or more, even more preferably four or more, or yet even more preferably four or more, of $R^1$ to $R^6$ contain a hydroxyl group. The mode of $R^1$ to $R^6$ containing a hydroxyl group may be a hydroxyl group itself, a hydrocarbon group having 1 to 10 carbon atoms and having a hydroxyl group, or a combination of these.

Specific examples of the amino alcohol compound represented by the chemical formula (1) or (2) include: bis(2-hydroxyethyl)iminotris(hydroxymethyl)methane (BIS-TRIS, melting point: 104° C., boiling point: above 300° C., corresponding to the chemical formula (1)); 2-amino-2-(hydroxymethyl)-1,3-propanediol (TRIS, melting point: 169° C. to 173° C., boiling point: above 300° C., corresponding to the chemical formula (1)); and 1,3-bis(tris (hydroxymethyl)methylamino)propane (BIS-TRIS propane, melting point: 164° C. to 165° C., boiling point: above 300° C., corresponding to the chemical formula (2)). Of these compounds, bis(2-hydroxyethyl)iminotris(hydroxymethyl) methane (BIS-TRIS) is preferably used as the solid reducing agent, in view of improving the sinterability of the metal particles and obtaining a bonded body having high bonding strength.

The above-described solid reducing agents may be used singly or in combinations of two or more thereof. In each case, the amount of the solid reducing agent in the composition for a bonding layer is preferably 0.1 parts by mass or more, and more preferably 1 part by mass or more, per 100 parts by mass of the metal powder, in view of improving the sinterability of the metal particles. Also, the amount of the solid reducing agent is practically 10 parts by mass or less, preferably 8 parts by mass or less, and even more preferably 5 parts by mass or less, in view of favorable applicability to the conductor while ensuring the amount of the metal powder in the composition for a bonding layer.

In view of the ease of application for forming the coating film, it is preferable that the composition for a bonding layer further contain a liquid medium. From the same viewpoint, the liquid medium is preferably liquid at room temperature (25° C.), and preferably has a boiling point of less than 300° C.

It is preferable that the liquid medium be a non-aqueous solvent, more preferably a monohydric or polyhydric alcohol, and even more preferably a polyhydric alcohol, in view of the ease of application of the composition for a bonding layer, the solubility of the solid reducing agent therein, and appropriate volatility. Examples of the polyhydric alcohol include propylene glycol (boiling point: 188° C.), ethylene glycol (boiling point: 197° C.), hexylene glycol (boiling point: 197° C.), diethylene glycol (boiling point: 245° C.), 1,3-butanediol (boiling point: 207° C.), 1,4-butanediol (boiling point: 228° C.), dipropylene glycol (boiling point: 231° C.), tripropylene glycol (boiling point: 273° C.), glycerol (boiling point: 290° C.), Polyethylene glycol 200 (boiling point: 250° C.), and Polyethylene glycol 300 (boiling point: 250° C.). The liquid mediums may be used singly or in combinations of two or more thereof.

In the case where the composition for a bonding layer contains a liquid medium, the amount of the liquid medium is preferably from 10 parts by mass to 40 parts by mass, and more preferably from 10 parts by mass to 35 parts by mass, per 100 parts by mass of the metal powder, in view of improving the shape retention of the coating film when the composition is applied to the conductor.

The composition for a bonding layer when unheated preferably has a viscosity of 20 Pa·s to 200 Pa·s, and more preferably 25 Pa·s to 150 Pa·s, at a shear rate of 10 s$^{-1}$ and 25° C., in view of the ease of application to the conductor for forming the coating film and the shape retention of the coating film. The viscosity of the composition for a bonding layer can be measured using a rheometer (viscoelasticity measuring instrument) with a sensor of a parallel-plate type.

The composition for a bonding layer may also contain other components, such as a binder, a surface tension regulator, an antifoaming agent, and a viscosity modifier, as long as the effects of the present invention can be exhibited. The total amount of the other components is from 0.1 parts by mass to 10 parts by mass per 100 parts by mass of the metal powder.

A bonded body having a bonding portion as described above can be favorably used in environments exposed to high temperatures, for example, in an in-vehicle electronic circuit or an electronic circuit in which a power device is implemented, by taking advantage of its characteristics including high bonding strength and heat conductivity.

INDUSTRIAL APPLICABILITY

According to the present invention, a bonded body including a semiconductor element is provided which has high heat resistance and in which the characteristics of the semiconductor element are unlikely to be adversely affected.

The invention claimed is:

1. A bonded body comprising:
a bonding layer containing Cu; and
a semiconductor element bonded to the bonding layer,
wherein the bonding layer includes an extending portion laterally extending from a peripheral edge of the semiconductor element,
in a cross-sectional view in a thickness direction, the extending portion rises from a peripheral edge of a bottom of the semiconductor element or from a vicinity of the peripheral edge of the bottom of the semiconductor element, and includes a side wall substantially spaced apart from a side of the semiconductor element,
a side of the semiconductor element contacts the extending portion at a contact portion,
a length of the contact portion in the thickness direction in the cross-sectional view is 20 µm or less, and
a length of the contact portion in a planar direction in a plan view is 20 µm or less.

2. The bonded body according to claim 1,
wherein the bonding layer contains Cu in an amount of 50 mass % or more.

3. The bonded body according to claim 1,
wherein the semiconductor element contains Si in an amount of 50 mass % or more.

4. The bonded body according to claim 1,
wherein the side wall is formed such that a distance between the side wall and the side of the semiconductor element gradually increases from the bottom of the semiconductor element toward an upper side, or is constant.

5. The bonded body according to claim 1,
wherein an average distance between the side wall and the side of the semiconductor element is 1 µm or more.

6. The bonded body according to claim 1,
wherein a structure (3) below is formed in the bonding layer:

where $R^3$ to $R^5$ each independently represent a hydrogen atom, a hydroxyl group, a hydrocarbon group having 1 to 10 carbon atoms, or a hydrocarbon group having 1 to 10 carbon atoms and having a hydroxyl group, and * represents a Cu-binding site.

7. A method for manufacturing the bonded body according to claim 1, the method comprising:
applying a composition for the bonding layer to a surface of a conductor to form a coating film, wherein the composition contains a metal powder containing Cu and a solid reducing agent;
drying the coating film to form a dried coating film; and
then superposing the semiconductor element on the dried coating film to obtain a stack in which the dried coating film is located between the conductor and the semiconductor element, and subsequently heating the stack while applying a pressure thereto to sinter the metal powder to thereby bond the conductor and the semiconductor element together.

8. A bonded body comprising:
a bonding layer containing Cu; and
a semiconductor element bonded to the bonding layer,
wherein the bonding layer includes an extending portion laterally extending from a peripheral edge of the semiconductor element,
in a cross-sectional view in a thickness direction, the extending portion rises from a peripheral edge of a bottom of the semiconductor element or from a vicinity of the peripheral edge of the bottom of the semiconductor element, and includes a side wall substantially spaced apart from a side of the semiconductor element, and
the extending portion does not include any portion where the side wall and the side of the semiconductor element are in contact with each other.

9. A method for manufacturing a bonded body, the method comprising:
applying a composition for a bonding layer to a surface of a conductor to form a coating film, wherein the composition contains a metal powder containing Cu and a solid reducing agent;
drying the coating film to form a dried coating film under atmospheric pressure; and
then superposing a semiconductor element on the dried coating film to obtain a stack in which the dried coating film is located between the conductor and the semiconductor element, and subsequently heating the stack while applying a pressure, which is more than the atmospheric pressure, thereto to sinter the metal powder to thereby bond the conductor and the semiconductor element together,
wherein no pressure, which is more than the atmospheric pressure, is applied to the dried coating film after the drying of the coating film and before the superposing of the semiconductor element.

* * * * *